United States Patent
Liaw (10) Patent No.: US 9,318,188 B2
(45) Date of Patent: Apr. 19, 2016

(54) SEMICONDUCTOR MEMORY WITH DATA LINE CAPACITIVE COUPLING

(71) Applicant: TAIWAN SEMICONDUCTOR MANUFACTURING COMPANY, LTD., Hsinchu County (TW)

(72) Inventor: Jhon-Jhy Liaw, Zhudong Township (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 180 days.

(21) Appl. No.: 13/918,787

(22) Filed: Jun. 14, 2013

(65) Prior Publication Data

US 2014/0369112 A1 Dec. 18, 2014

(51) Int. Cl.
*G11C 11/419* (2006.01)
*G11C 11/412* (2006.01)

(52) U.S. Cl.
CPC .......... *G11C 11/419* (2013.01); *G11C 11/4125* (2013.01)

(58) Field of Classification Search
CPC .......................... G11C 11/419; G11C 11/4125
See application file for complete search history.

(56) References Cited

U.S. PATENT DOCUMENTS

| 2014/0112062 A1* | 4/2014 | Trivedi et al. ................. 365/154 |
| 2014/0160871 A1* | 6/2014 | Zimmer et al. ........... 365/189.16 |
| 2014/0204657 A1* | 7/2014 | Dally ............................ 365/154 |

* cited by examiner

*Primary Examiner* — Richard Elms
*Assistant Examiner* — Ajay Ojha
(74) *Attorney, Agent, or Firm* — McDermott Will & Emery LLP (57) ABSTRACT

A semiconductor memory is disclosed that includes a first data line, a second data line, a first coupling line and a second coupling line. The first coupling line is configured to capacitively couple the first coupling line with the first data line. The second coupling line is configured to capacitively couple the second coupling line with the second data line.

22 Claims, 12 Drawing Sheets

SEMICONDUCTOR MEMORY WITH DATA LINE CAPACITIVE COUPLING

FIELD

The present disclosure relates to semiconductor memories.

BACKGROUND

Static random access memory (SRAM) is a type of semiconductor memory which stores data in the form of bits. SRAM includes cells which are disposed in an array. The SRAM cells include transistors coupled to bit lines and word lines. The bit lines and word lines are used to read data from and write data to the memory cell.

However, with the increasing down-scaling of integrated circuits, the operation voltages of the integrated circuits are reduced, along with the operation voltages of memories. Accordingly, read and write margins of the SRAM cells, which are measures of how reliably the data of the SRAM cells can be read from and written into, are reduced. The reduced read and write margins may cause errors in the respective read and write operations.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be open-ended, i.e., to mean including but not limited to.

Figure 1:
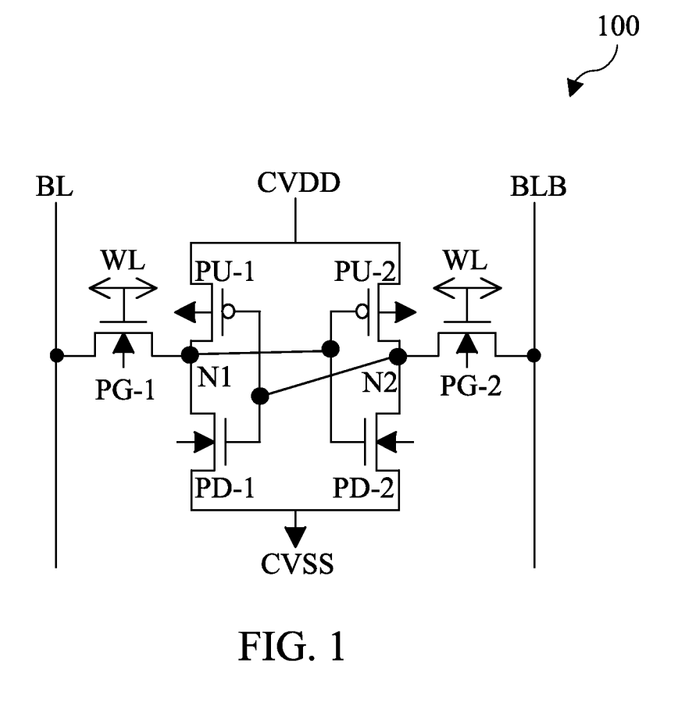
FIG. 1 is a schematic diagram of an SRAM cell circuit in accordance with some embodiments of the present disclosure.

FIG. 1 is a schematic diagram of an SRAM cell circuit 100 in accordance with some embodiments of the present disclosure. The SRAM cell circuit 100 includes two pass-gate devices PG-1 and PG-2 and transistors PU-1, PD-1, PU-2 and PD-2. In some embodiments, PU-1 and PU-2 are p-type fin field-effect transistors (FinFETs), and PD-1, PD-2, PG-1 and PG-2 are n-type FinFETs.

PG-1 and PG-2 work with the corresponding word line WL and the corresponding bit lines BL and BLB. The drain of PG-1 is coupled to the data node N1, and the drain of PG-2 is coupled to the data node N2. The sources of PG-1 and PG-2 are coupled to the bit lines BL and BLB, respectively. The gates of PG-1 and PG-2 are coupled to the corresponding word line WL.

The drains of PU-1 and PD-1 are coupled together at the data node N1. The gates of PU-1 and PD-1 are coupled together to the data node N2. The source of PU-1 is coupled to a power supply line CVDD having a power supply voltage. The source of PD-1 is coupled to a complementary power supply line CVSS having a complementary power supply voltage. The drains of PU-2 and PD-2 are coupled together at the data node N2. The gates of PU-2 and PD-2 are coupled together to the data node N1. The source of PU-2 is coupled to the power supply line CVDD. The source of PD-2 is coupled to the complementary power supply line CVSS.

PU-1 and PD-1 operate together as a first inverter. PU-2 and PD-2 operate together as a second inverter. The first and second inverters are cross-coupled and function as a data storage. A data bit with a logic state is reflected at the node N1, and the complement of the same data bit is reflected at the node N2.

In a read operation of the SRAM cell circuit 100, PG-1 and PG-2 are turned on by the signal at the word line WL. When PG-1 and PG-2 are turned on, the data bit at the node N1 is transferred through PG-1 to the bit line BL, and the data bit at the node N2 is transferred through PG-2 to the bit line BLB.

In a write operation of the SRAM cell circuit 100, a value to be written is provided at the bit line BL, and the complement of the same value is provided at the bit line BLB. When PG-1 and PG-2 are turned on by the signal at the word line WL, the value is written into the data storage.

Figure 2:
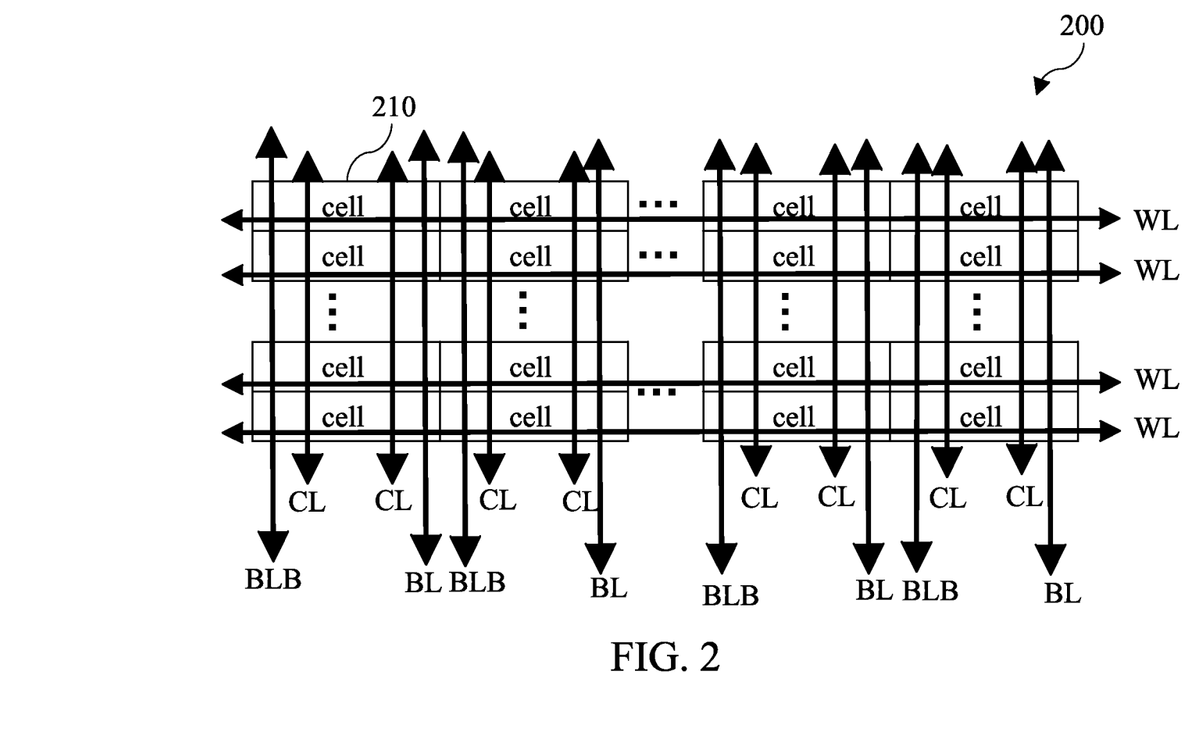
FIG. 2 is a top view of an SRAM in accordance with some embodiments of the present disclosure.

FIG. 2 is a top view of an SRAM 200 in accordance with some embodiments of the present disclosure. The SRAM 200 is an illustrative portion of an entire semiconductor memory. Other portions of the semiconductor memory are within the contemplated scope of the present disclosure.

As illustrated in FIG. 2, the SRAM 200 includes a plurality of memory cells 210 arranged in an array. Each of the memory cells 210 is labeled "cell" and includes the SRAM cell circuit 100 in FIG. 1. Each column of the memory cells 210 is associated with a pair of coupling lines CL and a pair of bit lines BL and BLB. Each row of the memory cells 210 is associated with a corresponding word line WL.

In a write operation of the SRAM 200, one of the memory cells 210 is selected to be written into, and the corresponding word line WL is applied with a logic high signal. The corresponding bit lines BL and BLB are configured to have values being written into the corresponding memory cell 210. The word lines WL corresponding to the unselected memory cells 210 are applied with a logic low signal, and the unselected memory cells 210 retain their values. The coupling lines CL are configured to assist the write operation of the SRAM 200. The operations of the coupling lines CL are described below.

Figure 3:
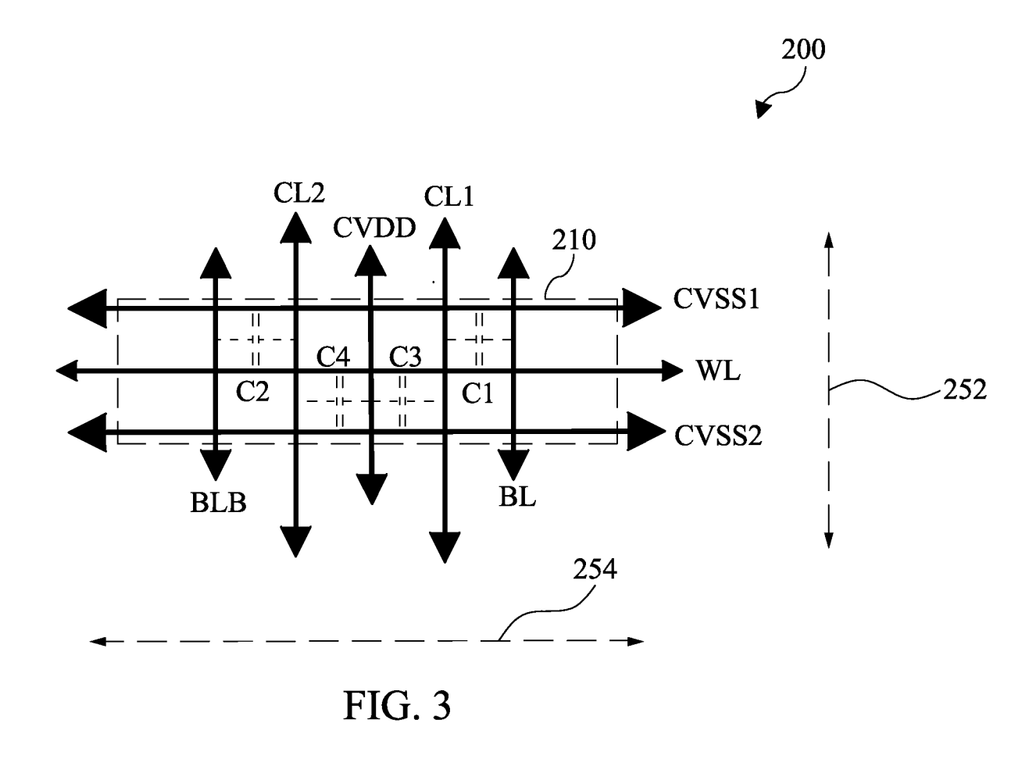
FIG. 3 is a top view of a portion associated with a memory cell of the SRAM in FIG. 2, in accordance with some embodiments of the present disclosure.

FIG. 3 is a top view of a portion associated with a memory cell 210 of the SRAM 200 in accordance with some embodiments of the present disclosure. The configuration in FIG. 3 is illustrative. Other configurations are within the contemplated scope of the present disclosure.

In the SRAM 200, the power supply line CVDD and the complementary power supply lines CVSS1 and CVSS2 are coupled to the memory cell 210. The power supply line CVDD is configured to provide a power supply voltage VDD for the memory cell 210. The complementary power supply lines CVSS1 and CVSS2 are each configured to provide a complementary power supply voltage VSS which, in some embodiments, is ground, for the memory cell 210.

The coupling line CL1 is configured to capacitively couple the coupling line CL1 with the bit line BL. Explained in a different way, a capacitance C1 is formed between the coupling line CL1 and the bit line BL. Similarly, the coupling line CL2 is configured to capacitively couple the coupling line CL2 with the bit line BLB. Explained in a different way, a capacitance C2 is formed between the coupling line CL2 and the bit line BLB.

In some embodiments, the coupling line CL1 is configured to capacitively couple the coupling line CL1 with the power supply line CVDD, and a capacitance C3 is formed therebetween. Further, the coupling line CL2 is configured to capacitively couple the coupling line CL2 with the power supply line CVDD, and a capacitance C4 is formed therebetween.

In some other embodiments, the coupling line CL1 is formed between the power supply line CVDD and the bit line BL in a conductive layer, and the coupling line CL2 is formed between the power supply line CVDD and the bit line BLB in the same conductive layer.

For illustration, the coupling lines CL1 and CL2, the power supply line CVDD, and the bit lines BL and BLB are formed in the first direction 252 which, in some embodiments, is a column direction. The complementary power supply lines CVSS1 and CVSS2 and the word line WL are formed in the second direction 254 which, in some embodiments, is a row direction.

As illustratively shown in FIG. 3, the coupling lines CL1 and CL2 are not coupled together. In some embodiments, the coupling lines CL1 and CL2 are coupled together outside the array of memory cells 210 in FIG. 2. As a result, the coupling lines CL1 and CL2 are configured to receive a same voltage pulse signal. For example, the coupling lines CL1 and CL2 commonly receive a signal which could be a falling pulse signal or a rising pulse signal.

Figure 4:
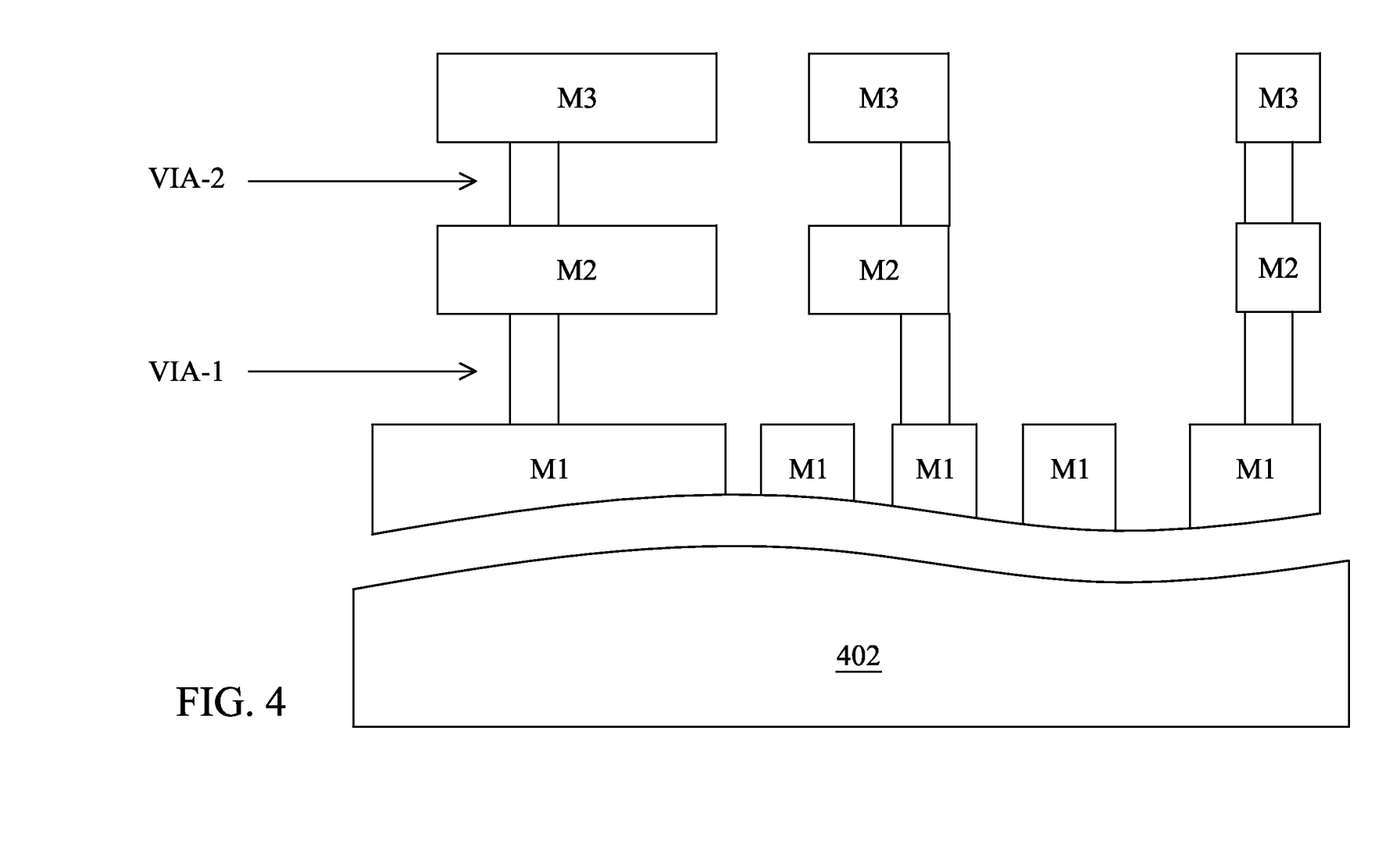
FIG. 4 is a schematic diagram illustrating in cross section an arrangement of connection levels related to the SRAM illustratively shown in FIG. 3, in accordance with some embodiments of the present disclosure.

FIG. 4 is a schematic diagram illustrating in cross section an arrangement of connection levels related to the SRAM 200 illustratively shown in FIG. 3, in accordance with some embodiments of the present disclosure.

For illustration, the conductive layer M1 is formed upon the substrate 402 by various ways, which, for simplicity, are not shown. The conductive layer M2 is formed upon the conductive layer M1, and is connected to the conductive layer M1 through the vias Via-1. The conductive layer M3 is formed upon the conductive layer M2, and is connected to the conductive layer M2 through the vias Via-2. Other semiconductor structures or layers between any two of the substrate 402 and the conductive layers M1, M2 and M3 are within the contemplated scope of the present disclosure.

In some embodiments, the lines CL1, CL2, BL, BLB and CVDD in FIG. 3 are formed in the conductive layer M1 in FIG. 4. Further, the lines CVSS1, CVSS2 and WL in FIG. 3 are formed in the conductive layer M2 in FIG. 4.

Figure 5:
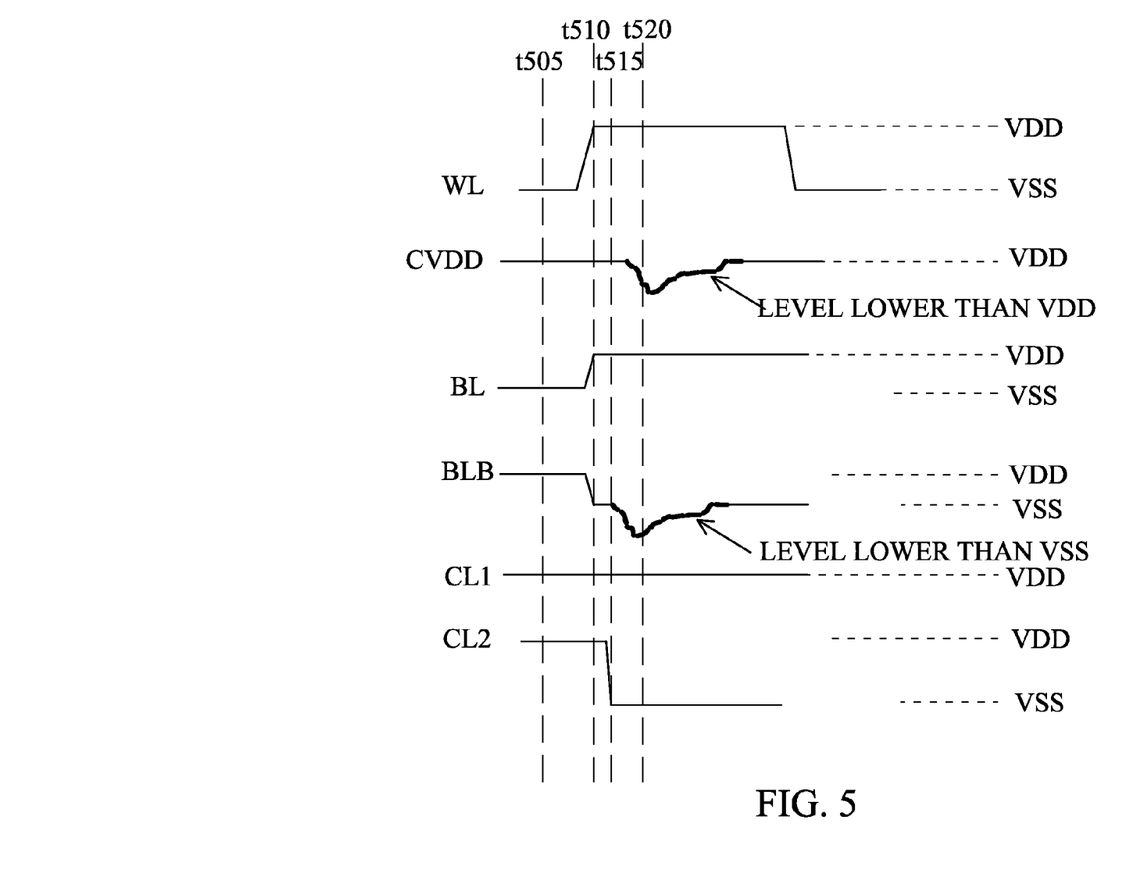
FIG. 5 is a graph of waveforms illustrating a write operation of the memory cell in FIG. 3, in accordance with some embodiments of the present disclosure.

FIG. 5 is a graph of waveforms illustrating a write operation of the memory cell 210 in FIG. 3, in accordance with some embodiments of the present disclosure. For illustration, VDD indicates a logic high value, and, in some embodiments, is the power supply voltage. Furthermore, VSS indicates a logic low value, and, in some embodiments, is ground. Moreover, the write operation of data "1" or "0" indicates writing the logic high or low value, respectively, into the memory cell 210. Details of the waveforms in FIG. 5 are explained with reference to FIG. 6.

Figure 6:
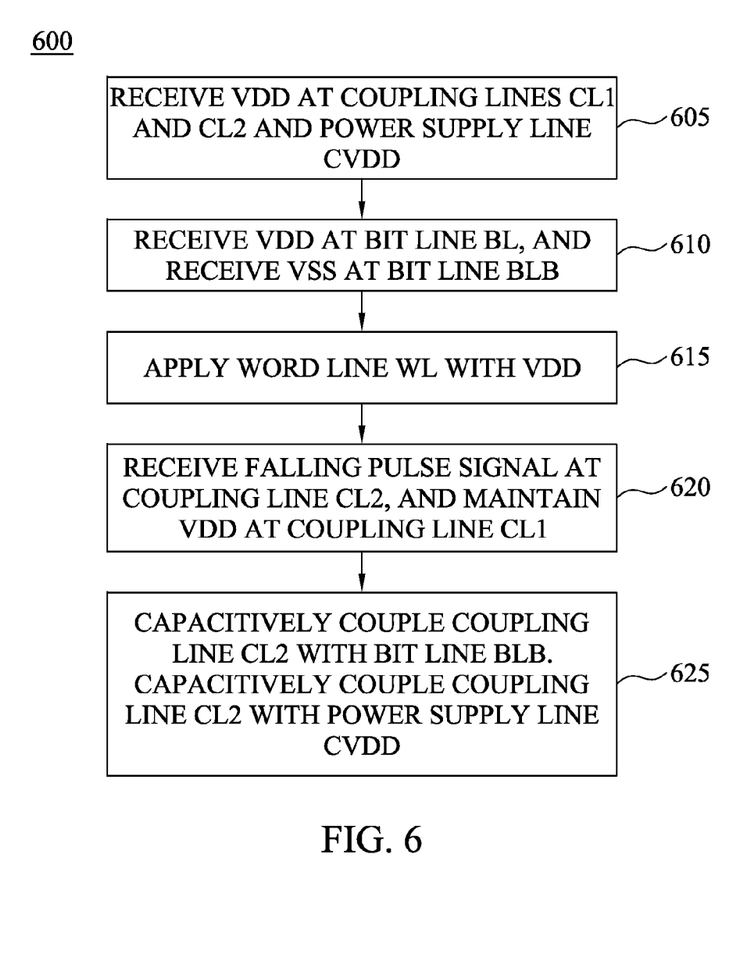
FIG. 6 is a flow chart of a method illustrating the write operation of the memory cell in FIG. 3, in accordance with some embodiments of the present disclosure.

FIG. 6 is a flow chart of a method 600 illustrating the write operation of the memory cell 210 in FIG. 3, in accordance with some embodiments of the present disclosure. For illustration, the operation of writing data "1" into the node N1 (shown in FIG. 1) of the memory cell 210 in FIG. 3 is described by the method 600 together with the waveforms in FIG. 5.

In operation 605, VDD is received at the coupling lines CL1 and CL2 before the write operation. VDD is also received at the power supply line CVDD. Operation 605 corresponds to a time t505 in FIG. 5.

In operation 610, VDD is received at the bit line BL, and VSS is received at the bit line BLB. Explained in a different way, the logic high value indicating data "1" to be written to the node N1 is provided at the bit line BL, and the logic low value to be written to the node N2 is provided at the bit line BLB. Operation 610 corresponds to a time t510 in FIG. 5.

In operation 615, the word line WL is applied with VDD. For simplicity, operation 615 also corresponds to time t510 in FIG. 5.

In operation 620, after VSS is received at the bit line BLB, a falling pulse signal having a fast transition from VDD to VSS is applied to the coupling line CL2. Moreover, VDD is maintained at the coupling line CL1. Operation 620 corresponds to time t515 in FIG. 5.

In operation 625, the coupling line CL2 is capacitively coupled with the bit line BLB in accordance with the falling pulse signal at the coupling line CL2. Explained in a different way, the capacitance C2 is formed between the coupling line CL2 and the bit line BLB. VSS at the bit line BLB is therefore pulled down due to the capacitance C2. As a result, a level lower than VSS is generated at the bit line BLB. In some embodiments, VSS is ground, and a negative voltage lower than ground is generated at the bit line BLB.

Additionally, the coupling line CL2 is also capacitively coupled with the power supply line CVDD in accordance with the falling pulse signal at the coupling line CL2. Alternatively stated, the capacitance C4 is formed between the coupling line CL2 and the power supply line CVDD. VDD at the power supply line CVDD is therefore pulled down due to the capacitance C4. As a result, a level lower than VDD is generated at the power supply line CVDD. Operation 625 corresponds to a time t520 in FIG. 5.

Referring to FIG. 1, FIG. 3 and FIG. 5, when the level lower than VSS is generated at the bit line BLB, the node N2 is pulled down below VSS through PG-2 in the write operation of the SRAM cell circuit 100. PU-1 is therefore turned on more quickly by the signal at the node N2 that is coupled to the gate of PU-1. Accordingly, the data at node N1 or the drain of PU-1 is pulled to VDD at the source of PU-1 more quickly. In other words, the data at the bit line BL is written into the data storage node N1 more quickly, thus improving the speed of the write operation.

Moreover, when the level lower than VDD is generated at the power supply line CVDD, the voltage difference between the gate and source of PU-1 or PU-2 becomes smaller. As a result, PU-1 or PU-2 is less turned on, and the node N1 or N2 is less pulled by PU-1 or PU-2, respectively, to the voltage at the power supply line CVDD. For illustration, in the write operation of the data "0" at the bit line BL, the node N1 is less pulled by PU-1. As a result, the data "0" at the bit line BL can be transferred more quickly to the node N1, thus improving the speed of the write operation as well.

The operations in FIG. 5 and FIG. 6 that are related to the write operation of data "1" to node N1 are for illustrative purposes. Operations to write data "0" to node N1 correspond to the operations to write data "1" to node N2, which can be appreciated based on the write operation of data "1" to node N1 and the symmetrical characteristic of the memory cell 100 in FIG. 1.

For example, in the operation of writing data "0" into node N1, VSS is received at the bit line BL, and VDD is received at the bit line BLB. After VSS is received at the bit line BL, a falling pulse signal having a fast transition from VDD to VSS is received at the coupling line CL1. Moreover, VDD is maintained at the coupling line CL2. Furthermore, the coupling line CL1 is capacitively coupled with the bit line BL in accordance with the falling pulse signal at the coupling line CL1. Similarly, the capacitance C1 is formed between the coupling line CL1 and the bit line BL. VSS at the bit line BL is therefore pulled down due to the capacitance C1. As a result, a level lower than VSS is generated at the bit line BL.

The coupling line CL1 is also capacitively coupled with the power supply line CVDD in accordance with the falling pulse signal at the coupling line CL1. Alternatively stated, the capacitance C3 is formed between the coupling line CL1 and the power supply line CVDD. VDD at the power supply line CVDD is therefore pulled down due to the capacitance C3. As a result, a level lower than VDD is generated at the power supply line CVDD.

In some embodiments, the aforementioned pull-down of the power supply line CVDD occurs when the power supply line CVDD is floated, because the power supply line CVDD is easily pulled down while the power supply line CVDD is floated.

Figure 7:
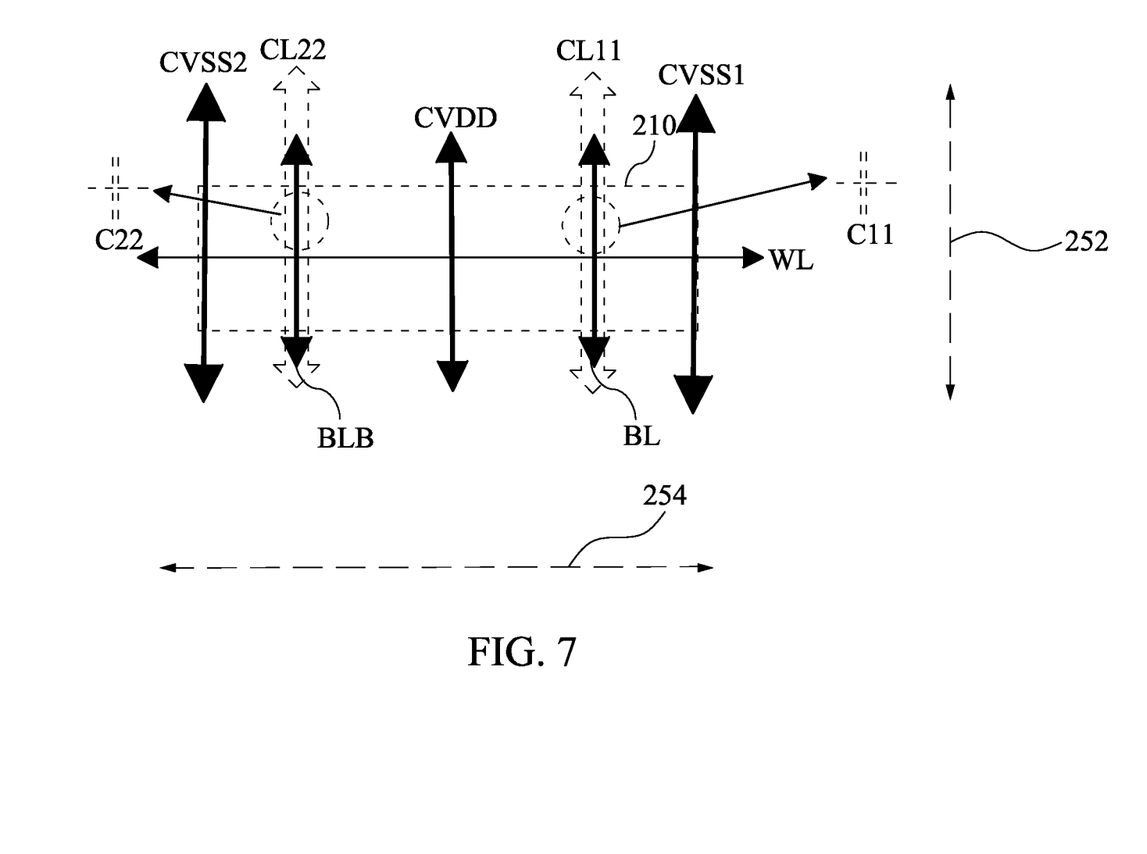
FIG. 7 is a top view of a portion associated with a memory cell of the SRAM in FIG. 2, in accordance with further embodiments of the present disclosure.

FIG. 7 is a top view of a portion associated with a memory cell 210 of the SRAM 200 in FIG. 2, in accordance with further embodiments of the present disclosure.

Compared with the embodiments in FIG. 3, the coupling lines CL11 and CL22 correspond to the coupling lines CL1 and CL2, respectively. The coupling line CL11 is above the bit line BL, and the coupling line CL22 is above the bit line BLB, however. In some embodiments, the coupling line CL11 fully covers the bit line BL, and the coupling line CL22 fully covers the bit line BLB.

Effectively, the coupling line CL11 s configured to capacitively couple the coupling line CL11 with the bit line BL, and a capacitance C11 is formed therebetween. Similarly, the coupling line CL22 s configured to capacitively couple the coupling line CL22 with the bit line BLB, and a capacitance C22 is formed therebetween.

In some embodiments, the power supply line CVDD, the bit lines BL and BLB, and the complementary power supply lines CVSS1 and CVSS2 are formed in the first direction 252.

Referring to FIG. 4 and FIG. 7, in some embodiments, the word line WL is formed in the conductive layer M1. Furthermore, the power supply line CVDD, the bit lines BL and BLB, and the complementary power supply lines CVSS1 and CVSS2 are formed in the conductive layer M2 upon the conductive layer M1. Moreover, the coupling lines CL11 and CL22 are formed in the conductive layer M3 upon the conductive layer M2.

The operation of the coupling line CL22 is similar to that of the coupling line CL2 in FIG. 3. For example, in the write operation, the coupling line CL22 capacitively couples the coupling line CL22 with the bit line BLB when the coupling line CL22 receives the voltage pulse signal having a transition from a logic high value to a logic low value. As a result, the capacitance C22 is formed.

Similarly, the operation of the coupling line CL11 is similar to that of the coupling line CL1 in FIG. 3. For example, in the write operation, the coupling line CL11 capacitively couples the coupling line CL11 with the bit line BL when the coupling line CL11 receives the voltage pulse signal having a transition from a logic high value to a logic low value. As a result, the capacitance C11 is formed.

Figure 8:
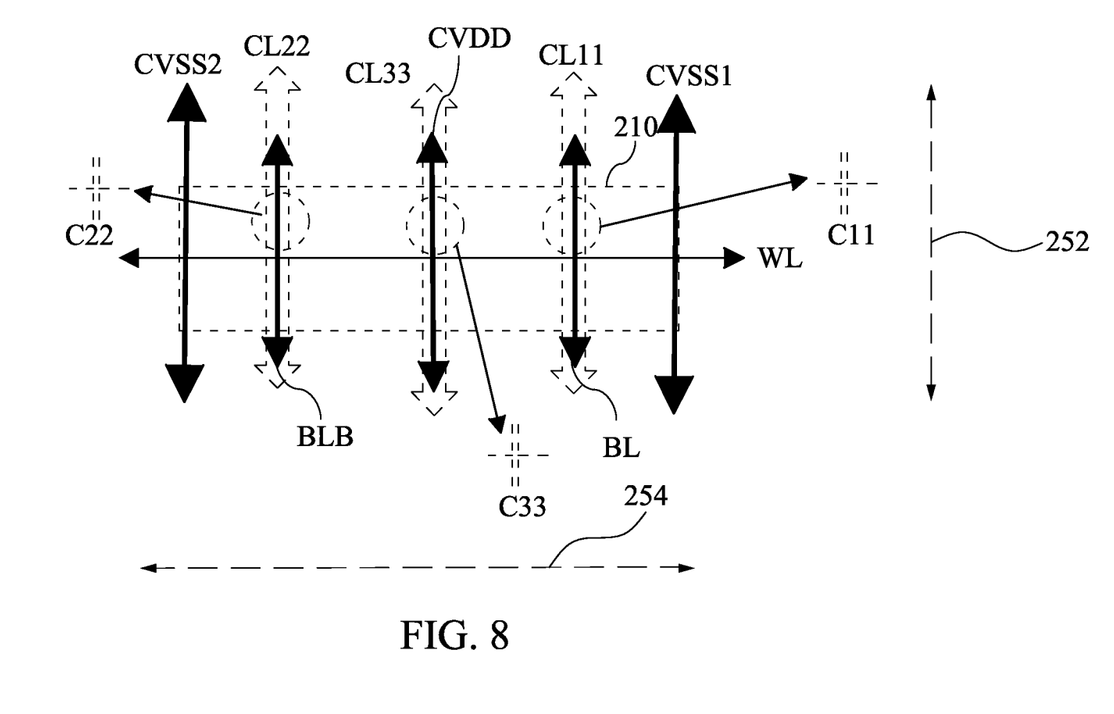
FIG. 8 is a top view of a portion associated with a memory cell of the SRAM in FIG. 2, in accordance with some yet other embodiments of the present disclosure.

FIG. 8 is a top view of a portion associated with a memory cell 210 of the SRAM 200 in FIG. 2, in accordance with some yet other embodiments of the present disclosure. Compared with the embodiments in FIG. 7, a coupling line CL33 is formed above the power supply line CVDD. In some embodiments, the coupling line CL33 fully covers the power supply line CVDD.

Effectively, the coupling line CL33 is configured to capacitively couple the coupling line CL33 with the power supply line CVDD, and a capacitance C33 is formed therebetween.

In some embodiments, the coupling lines CL11, CL22 and CL33 are formed in the first direction 252.

Referring to FIG. 4 and FIG. 8, in some embodiments, the coupling line CL33 is formed in the conductive layer M3 where the coupling lines CL11 and CL22 are formed.

The operation of the coupling line CL33 is similar to that of the coupling line CL1 or CL2 in FIG. 3. For example, in the write operation, the coupling line CL33 capacitively couples the coupling line CL33 with the power supply line CVDD when the coupling line CL33 receives the voltage pulse signal having a transition from a logic high value to a logic low value. As a result, the capacitance C33 is formed.

The coupling lines in FIG. 3, FIG. 7 and FIG. 8 are separately illustrated. Any combination of the coupling lines in FIG. 3, FIG. 7 and FIG. 8 is within the contemplated scope of the present disclosure.

Figure 9:
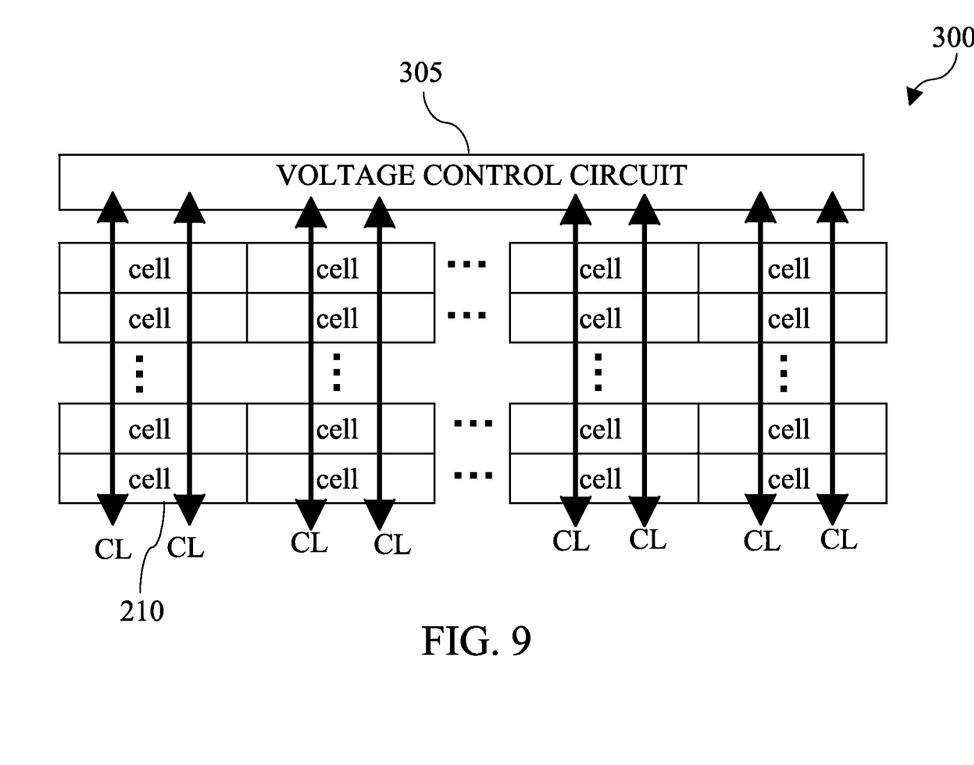
FIG. 9 is a top view of an SRAM in accordance with some further embodiments of the present disclosure.

FIG. 9 is a top view of an SRAM 300 in accordance with some further embodiments of the present disclosure. Compared with the SRAM 200 FIG. 2, the SRAM 300 further includes a voltage control circuit 305. The voltage control circuit 305 is connected to the coupling lines CL. The voltage control circuit 305 is configured to selectively output a voltage pulse signal to the corresponding coupling line(s) CL. In some embodiments, the voltage pulse signal is a falling pulse signal having a fast voltage transition from logic high to logic low. In other embodiments, the voltage pulse signal is a rising pulse signal having a fast voltage transition from logic low to logic high.

In further embodiments, the voltage control circuit 305 includes a selector (not labeled) or a multiplexer (not labeled). The selector or multiplexer is configured to output the voltage pulse signal to at least one of the coupling lines CL associated with each column of the memory cells 210. For illustration in FIG. 3 and FIG. 9, in some embodiments, the voltage control circuit 305 outputs the voltage pulse signal to the coupling line CL1 or the coupling line CL2. In other embodiments, the voltage control circuit 305 outputs the voltage pulse signal to both of the coupling lines CL1 and CL2.

Figure 10:
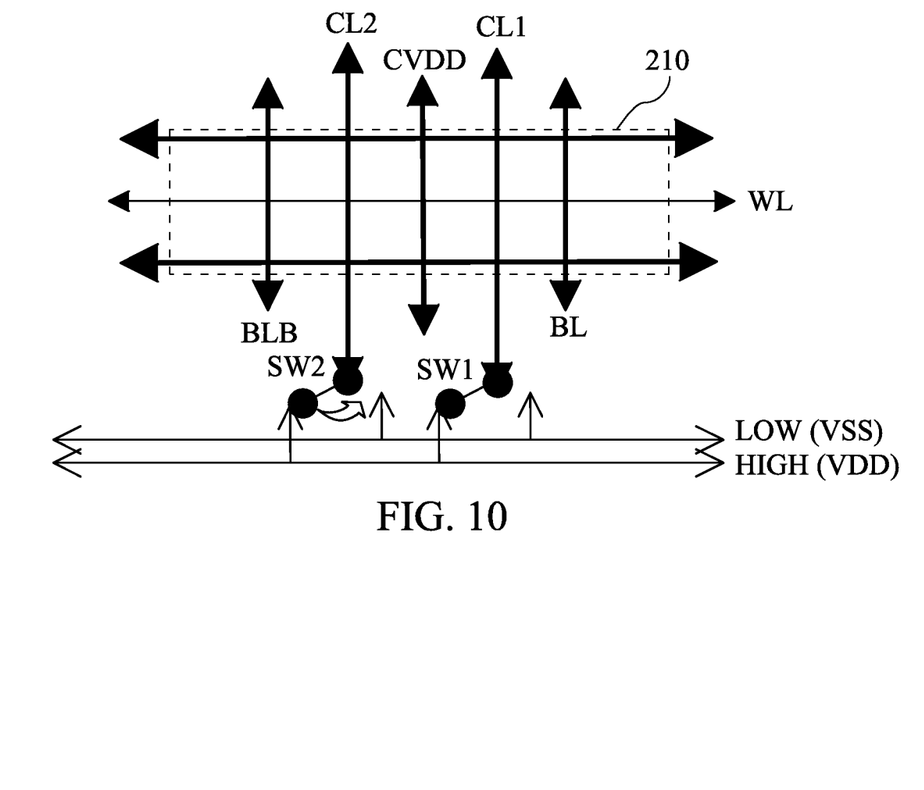
FIG. 10 is a schematic diagram illustrating the conditions before and in the write operation with respect to the voltage control circuit in FIG. 9, in accordance with some embodiments of the present disclosure.

FIG. 10 is a schematic diagram illustrating the conditions before and in the write operation with respect to the voltage control circuit 305 in FIG. 9, in accordance with some embodiments of the present disclosure.

For illustration, the voltage control circuit 305 in FIG. 9 transmits a first voltage signal having VDD on a logic high path, and transmits a second voltage signal having VSS on a logic low path. The coupling line CL1 is connected through a switch SW1 to the logic high path or the logic low path. The coupling line CL2 is connected through a switch SW2 to the logic high path or the logic low path.

Before the write operation, the switch SW1 connects the coupling line CL1 with the logic high path, and the switch SW2 connects the coupling line CL2 with the logic high path. As a result, the coupling lines CL1 and CL2 are pre-charged by the voltage control circuit 305 to have VDD.

For illustration in the write operation of data "1" to the node N1, the switch SW2 switches to connect the coupling line CL2 with the logic low path. As a result, the coupling line CL2 has a fast voltage transition from VDD to VSS. While the coupling line CL1 still has VDD, the coupling line CL2 is capacitively coupled with the bit line BLB and the power supply line CVDD.

In contrast, for illustration in the write operation of data "0" to the node N1, the switch SW1 switches to connect the coupling line CL1 with the logic low path. As a result, the coupling line CL1 has a fast voltage transition from VDD to VSS. While the coupling line CL2 still has VDD, the coupling line CL1 is capacitively coupled with the bit line BLB and the power supply line CVDD.

Figure 11:
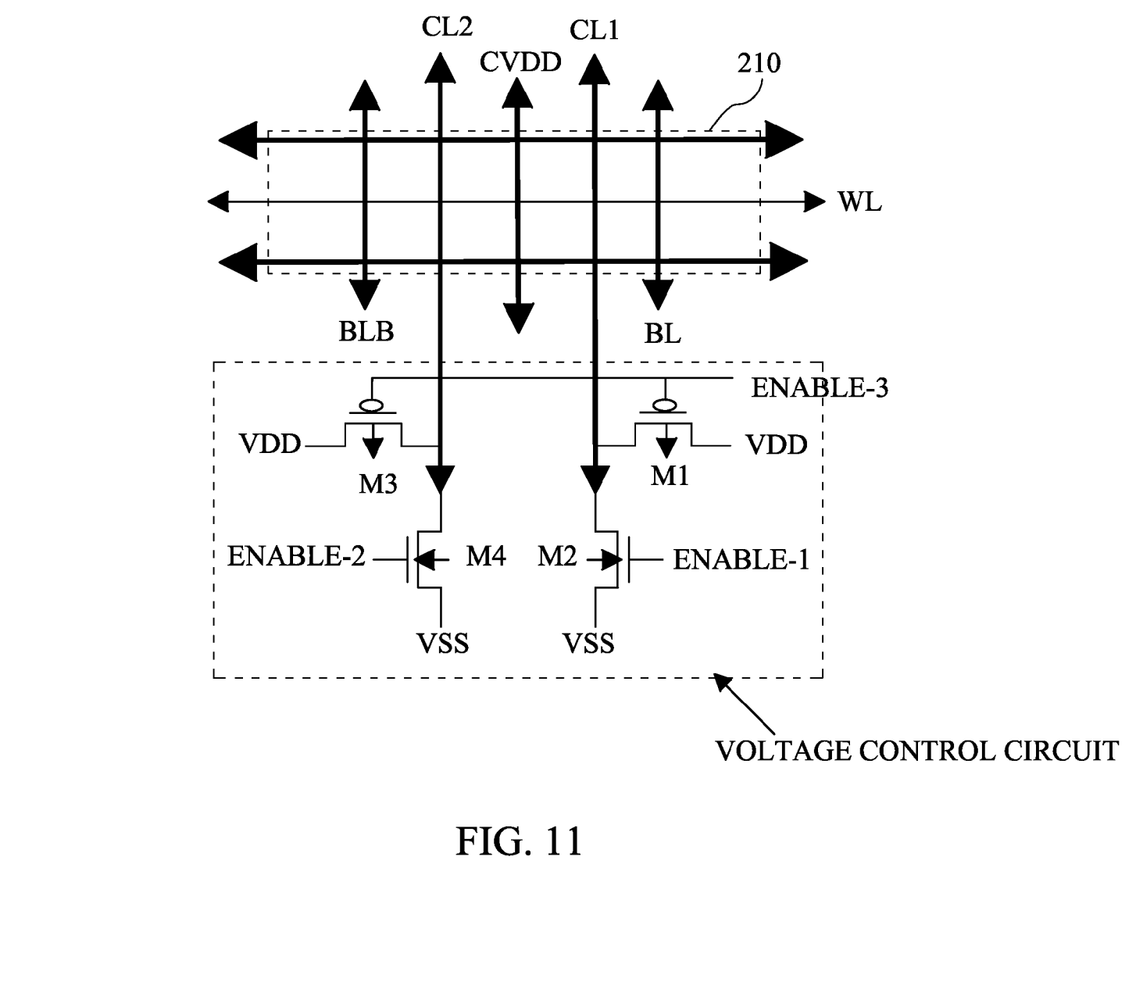
FIG. 11 is a schematic diagram of a portion associated with a memory cell in FIG. 2 and the voltage control circuit in FIG. 9, in accordance with some embodiments of the present disclosure.

FIG. 11 is a schematic diagram of a portion associated with a memory cell 210 and the voltage control circuit 305 in FIG. 9, in accordance with some embodiments of the present disclosure.

For illustration, the voltage control circuit 305 in FIG. 9 includes transistors M1-M4. In some embodiments, the transistors M1 and M3 are PMOS transistors, and the transistors M2 and M4 are NMOS transistors.

The transistor M1 has a gate configured to receive a control signal ENABLE-3, a source configured to receive VDD, and a drain coupled to the coupling line CL1. In some embodiments, the control signal ENABLE-3 is VSS. The transistor M2 has a gate configured to receive a control signal ENABLE-1, a drain coupled to the coupling line CL1, and a source configured to receive VSS. The transistor M3 has a gate configured to receive the control signal ENABLE-3, a source configured to receive VDD, and a drain coupled to the coupling line CL2. The transistor M4 has a gate configured to receive a control signal ENABLE-2, a drain coupled to the coupling line CL2, and a source configured to receive VSS.

Various operations of the embodiments in FIG. 11 correspond to the operations in FIG. 6, and further include operations corresponding to the transistors M1-M4, which are illustrated below.

Before the write operation of the memory cell 210, the transistors M2 is turned off by the control signal ENABLE-1, and the transistors M4 is turned off by the control signal ENABLE-2. Furthermore, the transistors M1 and M3 are turned on by the control signal ENABLE-3. As a result, VDD is transmitted from the voltage control circuit 305 to the coupling lines CL1 and CL2.

In the write operation of data "1" to the node N1, the transistor M2 remains turned off, the transistors M1 and M3 are turned off by the control signal ENABLE-3. Moreover, the transistor M4 is turned on by the control signal ENABLE-2. As a result, the coupling line CL2 has a fast voltage transition from VDD to VSS. The falling pulse signal corresponding to the transition from VDD to VSS is therefore received at the coupling line CL2.

In contrast, in the write operation of data "0" to the node N1, the transistor M4 remains turned off, the transistors M1 and M3 are turned off by the control signal ENABLE-3. Moreover, the transistor M2 is turned on by the control signal ENABLE-1. As a result, the coupling line CL1 has a fast voltage transition from VDD to VSS. The falling pulse signal corresponding to the transition from VDD to VSS is therefore received at the coupling line CL1.

Figure 12:
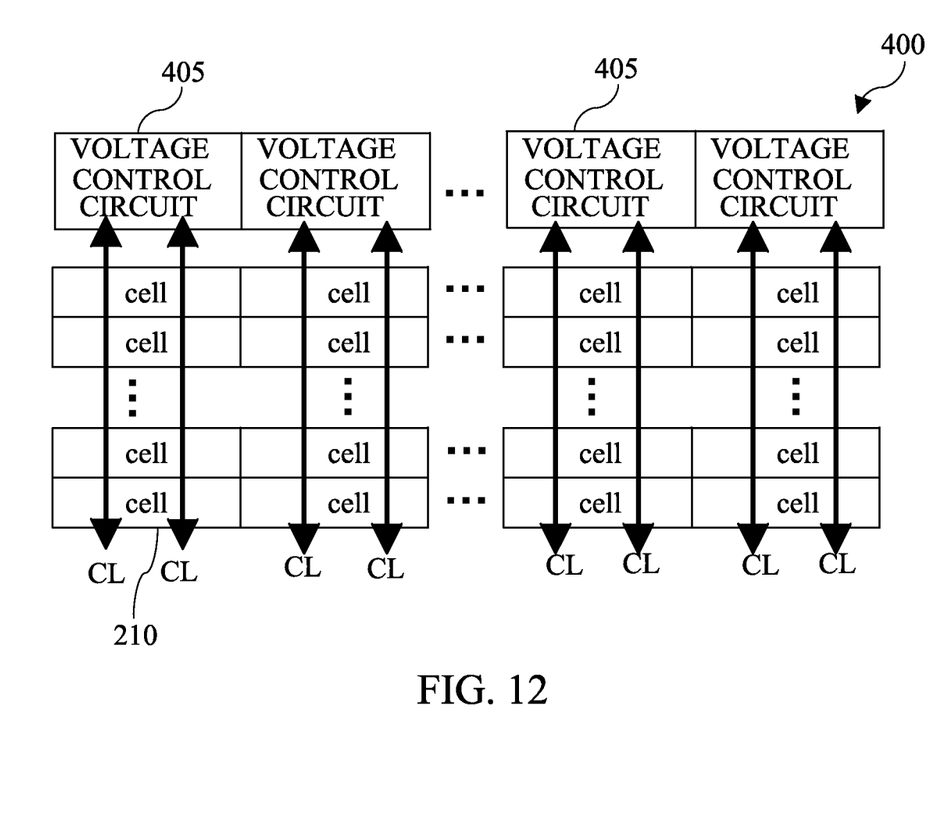
FIG. 12 is a top view of an SRAM in accordance with some yet other embodiments of the present disclosure.

FIG. 12 is a top view of an SRAM 400 in accordance with some yet other embodiments of the present disclosure. Compared with the SRAM 300 in FIG. 9, the SRAM 400 includes a plurality of voltage control units 405. Each voltage control unit 405 is coupled to the coupling lines CL associated with one column of the memory cells 210. Moreover, each voltage control unit 405 is configured to output a voltage signal to one of the coupling lines CL associated with one column of the memory cells 210, in the write operation of a selected one of the memory cells 210.

In operation, compared with the SRAM 300 in FIG. 9, each voltage control units 405 individually outputs the voltage signal to at least one of the coupling lines CL.

The semiconductor memory and method of accessing a semiconductor memory disclosed herein enable the speed of write operation to be improved.

In this document, except for the term "capacitively coupled", the term "coupled" may be termed as "electrically coupled", and the term "connected" may be termed as "electrically connected". "Coupled" and "connected" may also be used to indicate that two or more elements cooperate or interact with each other.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In some embodiments, a semiconductor memory is disclosed that includes a first data line, a second data line, a first coupling line and a second coupling line. The first coupling line is configured to capacitively couple the first coupling line with the first data line. The second coupling line is configured to capacitively couple the second coupling line with the second data line.

Also disclosed is a semiconductor memory including a plurality of memory cells, a pair of data lines, and a plurality of coupling lines. The memory cells are arranged in a first direction and a second direction perpendicular to the first direction. The data lines are associated with at least one of the memory cells arranged in the first direction. The coupling lines include a first coupling line and a second coupling line both associated with the at least one of the memory cells arranged in the first direction. The first coupling line and one of the data lines are configured to have capacitance therebetween, and the second coupling line and the other of the data lines are configured to have capacitance therebetween.

A method of accessing a semiconductor memory is also disclosed in which a first voltage is received at a first data line, and a second voltage is received at a second data line, during a write operation of the semiconductor memory, in which the first voltage is lower than the second voltage, and a first coupling line is capacitively coupled with the first data line to lower the first voltage at the first data line in the write operation of the semiconductor memory.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A semiconductor memory, comprising:
   a first data line and a second data line which are configured to transmit signals in a write operation;
   a first coupling line configured to capacitively couple the first coupling line with the first data line; and
   a second coupling line configured to capacitively couple the second coupling line with the second data line.

2. The semiconductor memory of claim 1, further comprising:
   a power supply line, wherein
   the first coupling line is configured to capacitively couple the first coupling line with the power supply line, and
   the second coupling line is configured to capacitively couple the second coupling line with the power supply line.

3. The semiconductor memory of claim 1, further comprising:
   a third coupling line configured to capacitively couple the third coupling line with the first data line; and
   a fourth coupling line configured to capacitively couple the fourth coupling line with the second data line.

4. The semiconductor memory of claim 3, wherein the first and second coupling lines and the first and second data lines are formed in a first conductive layer, and the third and fourth coupling lines are formed in a second conductive layer different from the first conductive layer.

5. The semiconductor memory of claim 4, further comprising:
   a control line formed in a third conductive layer which is formed below the first conductive layer or upon the second conductive layer.

6. The semiconductor memory of claim 1, wherein the first and second data lines are formed in a first conductive layer, and the first and second coupling lines are formed in a second conductive layer different from the first conductive layer.

7. The semiconductor memory of claim 6, further comprising:
   a power supply line formed in the first conductive layer.

8. The semiconductor memory of claim 7, further comprising:
   a third coupling line configured to capacitively couple the third coupling line with the power supply line.

9. The semiconductor memory of claim 8, wherein the third coupling line is formed in the second conductive layer.

10. The semiconductor memory of claim 1, further comprising:
    a voltage control circuit configured to output a voltage pulse signal to the first coupling line, the second coupling line, or both the first and second coupling lines.

11. The semiconductor memory of claim 10, wherein the voltage control circuit further comprises:
    a first transistor having a control terminal configured to receive a first control signal, a first terminal configured to receive a first voltage, and a second terminal electrically coupled to the first coupling line;
    a second transistor having a control terminal configured to receive a second control signal, a first terminal electrically coupled to the first coupling line, and a second terminal configured to receive a second voltage;
    a third transistor having a control terminal configured to receive the first control signal, a first terminal configured to receive the first voltage, and a second terminal electrically coupled to the second coupling line; and
    a fourth transistor having a control terminal configured to receive a third control signal, a first terminal electrically coupled to the second coupling line, and a second terminal configured to receive the second voltage.

12. A semiconductor memory, comprising:
    a plurality of memory cells arranged in a first direction and a second direction perpendicular to the first direction;
    a pair of data lines configured to transmit signals to the memory cells in a write operation, and associated with at least one of the memory cells arranged in the first direction; and
    a plurality of coupling lines comprising a first coupling line and a second coupling line both associated with the at least one of the memory cells arranged in the first direction;
    wherein the first coupling line and one of the data lines are configured to have capacitance therebetween, and the second coupling line and the other of the data lines are configured to have capacitance therebetween.

13. The semiconductor memory of claim 12, further comprising:
    a power supply line electrically coupled to the memory cells;
    wherein the first coupling line, the second coupling line, the power supply line, and the data lines are formed in the first direction.

14. The semiconductor memory of claim 13, wherein
    the first coupling line, the second coupling line, the power supply line, and the data lines are formed in a first conductive layer,
    the first coupling line is formed between the power supply line and one of the data lines, and
    the second coupling line is formed between the power supply line and the other of the data lines.

15. The semiconductor memory of claim 14, further comprising:
    a third coupling line formed upon one of the data lines in the first direction, in a second conductive layer upon the first conductive layer; and
    a fourth coupling line formed upon the other of the data lines in the first direction, in the second conductive layer upon the first conductive layer.

16. The semiconductor memory of claim 15, further comprising:
    a control line formed in a third conductive layer which is formed below the first conductive layer or upon the second conductive layer.

17. The semiconductor memory of claim 12, wherein
the data lines are formed in a first conductive layer, in the first direction,
the first coupling line is formed upon one of the data lines in the first direction, in a second conductive layer upon the first conductive layer, and
the second coupling line is formed upon the other of the data lines in the first direction, in the second conductive layer upon the first conductive layer.

18. The semiconductor memory of claim 17, further comprising:
a power supply line formed in the first direction, in the first conductive layer.

19. The semiconductor memory of claim 18, further comprising:
a third coupling line formed upon the power supply line in the first direction, in the second conductive layer.

20. The semiconductor memory of claim 12, further comprising:
a voltage control circuit configured to selectively output a voltage signal to at least one of the coupling lines during a write operation.

21. The semiconductor memory of claim 12, further comprising:
a plurality of voltage control units arranged in the second direction;
wherein one of the voltage control units is configured to output a voltage signal to one of the first coupling line and the second coupling line during a write operation of a selected one of the memory cells.

22. The semiconductor memory of claim 12, further comprising:
a first transistor having a control terminal configured to receive a first control signal, a first terminal configured to receive a first voltage, and a second terminal electrically coupled to the first coupling line;
a second transistor having a control terminal configured to receive a second control signal, a first terminal electrically coupled to the coupling line, and a second terminal configured to receive a second voltage;
a third transistor having a control terminal configured to receive the first control signal, a first terminal configured to receive the first voltage, and a second terminal electrically coupled to the second coupling line; and
a fourth transistor having a control terminal configured to receive a third control signal, a first terminal electrically coupled to the second coupling line, and a second terminal configured to receive the second voltage.

* * * * *